(12) United States Patent
Gaudiana et al.

(10) Patent No.: US 8,168,087 B2
(45) Date of Patent: *May 1, 2012

(54) PATTERNED PHOTOVOLTAIC CELL

(75) Inventors: Russell Gaudiana, Merrimack, NH (US); Jin-An He, North Chelmsford, MA (US); David Waller, Lexington, MA (US)

(73) Assignee: Konarka Technologies, Inc., Lowell, MA (US)

( * ) Notice: Subject to any disclaimer, the term of this patent is extended or adjusted under 35 U.S.C. 154(b) by 469 days.

This patent is subject to a terminal disclaimer.

(21) Appl. No.: 12/489,933

(22) Filed: Jun. 23, 2009

(65) Prior Publication Data
US 2009/0256106 A1    Oct. 15, 2009

Related U.S. Application Data

(62) Division of application No. 11/311,805, filed on Dec. 19, 2005.

(60) Provisional application No. 60/637,843, filed on Dec. 20, 2004, provisional application No. 60/638,070, filed on Dec. 21, 2004.

(51) Int. Cl.
*C09B 67/02* (2006.01)
*H01L 31/20* (2006.01)

(52) U.S. Cl. ........... 252/501.1; 252/514; 252/519.3; 252/519.21; 252/519.4; 136/263

(58) Field of Classification Search ......... 252/501.1, 252/514, 519.3, 519.21, 519.4; 136/263
See application file for complete search history.

(56) References Cited

U.S. PATENT DOCUMENTS

| 6,858,158 | B2 | 2/2005 | Chittibabu et al. |
| 7,572,396 | B2* | 8/2009 | Gaudiana et al. ........ 252/519.21 |
| 2003/0008157 | A1 | 1/2003 | Shiho et al. |
| 2003/0155004 | A1 | 8/2003 | Takahashi et al. |
| 2003/0175411 | A1* | 9/2003 | Kodas et al. .............. 427/58 |
| 2003/0188777 | A1 | 10/2003 | Guadiana et al. |
| 2003/0189402 | A1 | 10/2003 | Guadiana et al. |
| 2003/0192584 | A1 | 10/2003 | Beckenbaugh et al. |
| 2003/0230337 | A1 | 12/2003 | Gaudiana et al. |
| 2004/0025934 | A1 | 2/2004 | Chittibabu et al. |
| 2004/0163700 | A1 | 8/2004 | Mizuta et al. |
| 2004/0241551 | A1 | 12/2004 | Nakamura et al. |
| 2004/0267018 | A1 | 12/2004 | Elliott et al. |
| 2005/0045851 | A1 | 3/2005 | He et al. |
| 2005/0081911 | A1* | 4/2005 | Islam et al. .............. 136/263 |
| 2005/0092359 | A1 | 5/2005 | Uchida et al. |
| 2005/0098206 | A1 | 5/2005 | Uchida et al. |
| 2005/0211292 | A1 | 9/2005 | Chittibabu et al. |
| 2005/0268962 | A1 | 12/2005 | Gaudiana et al. |
| 2005/0274408 | A1 | 12/2005 | Li et al. |
| 2006/0005876 | A1 | 1/2006 | Gaudiana et al. |
| 2006/0016472 | A1 | 1/2006 | Park et al. |
| 2006/0076048 | A1 | 4/2006 | Gaudiana et al. |
| 2006/0234505 | A1 | 10/2006 | Asano et al. |
| 2007/0012349 | A1 | 1/2007 | Gaudiana et al. |
| 2007/0113885 | A1 | 5/2007 | Chan et al. |
| 2007/0277871 | A1 | 12/2007 | Lee et al. |

FOREIGN PATENT DOCUMENTS

| JP | 2005251736 A * | 9/2005 |
| WO | WO 03/038508 | 5/2003 |
| WO | WO 03/085773 | 10/2003 |
| WO | WO 2005/055286 | 6/2005 |

OTHER PUBLICATIONS

Reg. No. 96-48-0, Nov. 16, 1984.
Reg. No. 107-98-2, Nov. 16, 1984.
Reg. No. 127-19-5, Nov. 16, 1984.
Reg. No. 41593-38-8, Nov. 16, 1984.
Reg. No. 502693-09-6, Apr. 11, 2003.
Reg. No. 31659-05-9, Nov. 16, 1984.
Reg. No. 141460-19-7, May 22, 1992.
Reg. No. 143169-03-3, Aug. 28, 1992.

* cited by examiner

*Primary Examiner* — Douglas Mc Ginty
(74) *Attorney, Agent, or Firm* — Fish & Richardson P.C.

(57) ABSTRACT

Patterned photovoltaic cells, as well as related components and methods, are disclosed.

6 Claims, 6 Drawing Sheets

FIG. 8 ns # PATTERNED PHOTOVOLTAIC CELL

CROSS REFERENCE TO RELATED APPLICATIONS

This application is a divisional application of and claims priority to U.S. application Ser. No. 11/311,805, filed on Dec. 19, 2005, which claims priority to U.S. Provisional Application Ser. No. 60/637,843, filed on Dec. 20, 2004, and U.S. Provisional Application Ser. No. 60/638,070, filed on Dec. 21, 2004. These patent applications are hereby incorporated herein by reference in their entirety.

TECHNICAL FIELD

This invention relates to patterned photovoltaic cells, as well as related components and methods.

BACKGROUND

Photovoltaic cells, sometimes called solar cells, can convert light, such as sunlight, into electrical energy. One type of photovoltaic cell is a dye-sensitized solar cell (DSSC).

Figure 1:
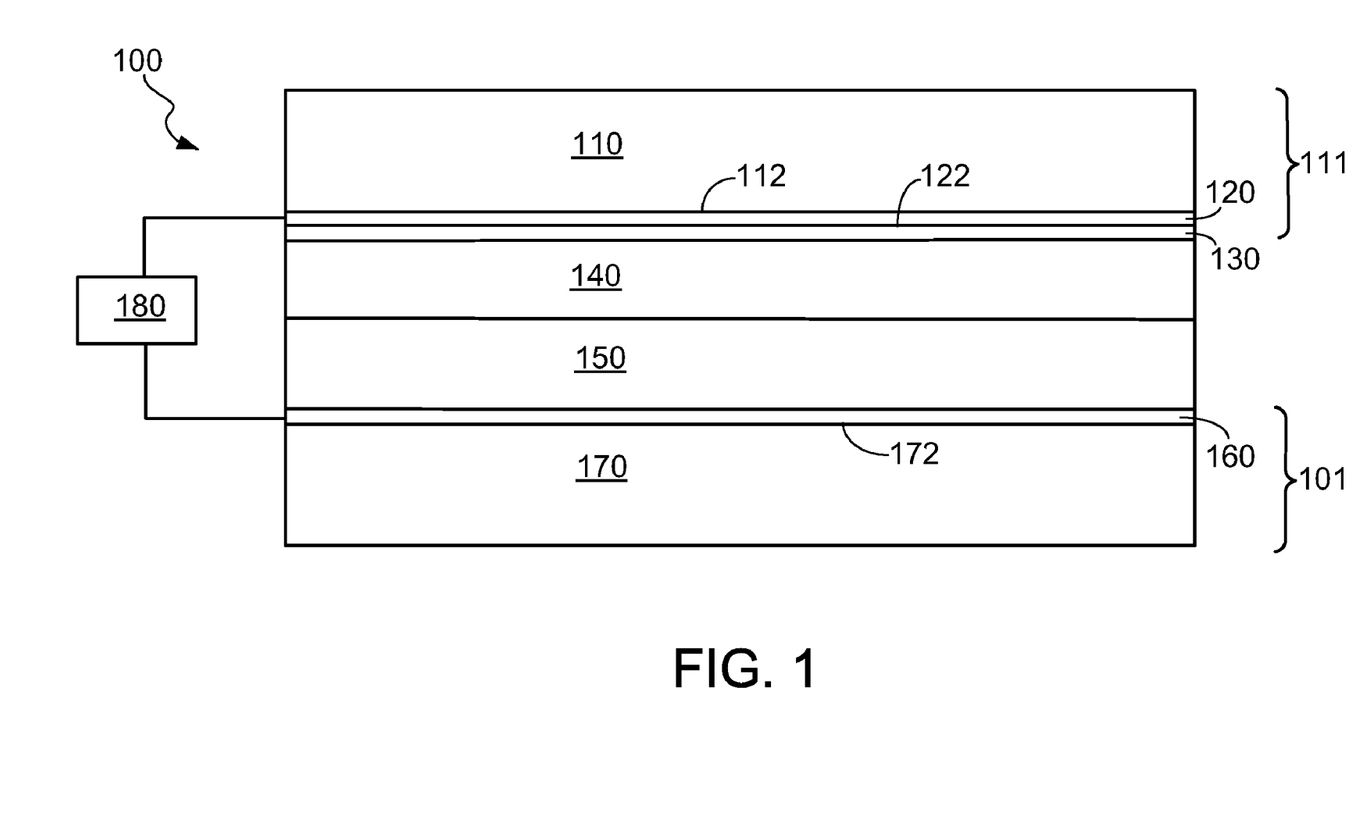
FIG. 1 is a cross-sectional view of an embodiment of a photovoltaic cell.

Referring to FIG. 1, a DSSC 100 includes a charge carrier layer 140 (e.g., including an electrolyte, such as an iodide/iodine solution) and a photoactive layer 150 (e.g., including a semiconductor material, such as $TiO_2$ particles) disposed between an electrode 101 and a counter electrode 111. Photoactive layer 150 also includes a photosensitizing agent, such as a dye. In general, the photosensitizing agent is capable of absorbing photons within a wavelength range of operation (e.g., within the solar spectrum). Electrode 101 includes a substrate 170 (e.g., a glass or polymer substrate) and an electrically conductive layer 160 (e.g., an ITO layer or tin oxide layer) disposed on an inner surface 172 of substrate 170. Counter electrode 111 includes a substrate 110, an electrically conductive layer 120 (e.g., ITO layer or tin oxide layer), and a catalytic layer 130 (e.g., containing platinum), which catalyzes a redox reaction in charge carrier layer 140. Electrically conductive layer 120 is disposed on an inner surface 112 of substrate 110, while catalytic layer 130 is disposed on a surface 122 of electrically conductive layer 120. Electrode 101 and counter electrode 111 are connected by wires across an external electrical load 180.

During operation, in response to illumination by radiation (e.g., in the solar spectrum), DSSC 100 undergoes cycles of excitation, oxidation, and reduction that produce a flow of electrons across load 180. Incident light excites photosensitizing agent molecules in photoactive layer 150. The photoexcited photosensitizing agent molecules then inject electrons into the conduction band of the semiconductor in photoactive layer 150, which leaves the photosensitizing agent molecules oxidized. The injected electrons flow through the semiconductor material, to electrically conductive layer 160, then to external load 180. After flowing through external load 180, the electrons flow to layer 120, then to layer 130 and subsequently to layer 140, where the electrons reduce the electrolyte material in charge carrier layer 140 at catalytic layer 130. The reduced electrolyte can then reduce the oxidized photosensitizing agent molecules back to their neutral state. The electrolyte in layer 140 can act as a redox mediator to control the flow of electrons from counter electrode 111 to working electrode 101. This cycle of excitation, oxidation, and reduction is repeated to provide continuous electrical energy to external load 180.

SUMMARY

This invention relates to patterned photovoltaic cells, as well as related components and methods.

In certain instances, it may be desirable for a photovoltaic cell to have a particular appearance. As an example, in embodiments in which a photovoltaic cell is incorporated as part of military wear, it may be desirable for the photovoltaic cell to have the appearance of a camouflage pattern. As another example, in embodiments in which a photovoltaic cell is incorporated as part of a roof, it may be desirable for the photovoltaic cell to have the appearance of a roof tile pattern or a shingle pattern.

In one aspect, the invention features a method that includes combining a plurality of dyes with a material (e.g., a semiconductor) to form a photoactive layer in which the plurality of dyes are arranged in a pattern, and disposing the photoactive layer between two electrodes to provide a photovoltaic cell.

In another aspect, the invention features a photovoltaic cell that includes two electrodes and a photoactive layer between the electrodes. The photoactive layer includes a plurality of dyes arranged in a pattern.

In a further aspect, the invention features a module including multiple photovoltaic cells that are electrically connected (e.g., with some of the cells in series and/or with some of the cells in parallel). At least some of the photovoltaic cells include two electrodes and a photoactive layer between the electrodes, where the photoactive layer includes a plurality of dyes arranged in a pattern.

Embodiments can include one or more of the following features.

The pattern can be, for example, a camouflage pattern, a roof tile pattern, a shingle pattern. In some embodiments, the pattern provided by the photovoltaic cell can define the pattern of the housing a portable electronic device (e.g., a laptop computer, a cell phone). In certain embodiments, the pattern provided by the photovoltaic cell can define the pattern on the body of an automobile.

The photoactive layer can include at least two (e.g., at least three, at least four, at least five, at least six, at least seven, at least eight) different dyes. At least some of the dyes (e.g., at least two of the dyes, at least three of the dyes, at least four of the dyes) can have a different color. For example, each of the dyes can have a different color.

The dyes can be applied to the material (e.g., semiconductor material) using silk screening, ink jet printing, or gravure printing.

The material with which the dyes are combined can be a semiconductor material. In some embodiments, the semiconductor material can be titania, such as sintered titania. Generally, the semiconductor material is in the form of nanoparticles.

The photovoltaic cell can further include a substrate, such as a polymer substrate, that supports the photoactive layer. In certain embodiments, the substrate can be formed of polyethylene terephthalate, polyethylene naphthalate, polyethylene, polypropylene, polyamide, polymethacrylate, polycarbonate, and/or polyurethane.

The photovoltaic cell can be a dye sensitized solar cell.

In another aspect, the invention features a method that includes combining a plurality of polymer compositions with a material (e.g., an electron acceptor) to form a photoactive layer in which the plurality of polymer compositions are arranged in a pattern, and disposing the photoactive layer between two electrodes to provide a photovoltaic cell.

In an additional aspect, the invention features a photovoltaic cell that includes two electrodes and a photoactive layer between the electrodes. The photoactive layer includes a plurality of polymer compositions arranged in a pattern.

In a further aspect, the invention features a module including multiple photovoltaic cells that are electrically connected (e.g., with some of the cells in series and/or with some of the cells in parallel). At least some of the photovoltaic cells include two electrodes and a photoactive layer between the electrodes, where the photoactive layer includes a plurality of polymer compositions arranged in a pattern.

Embodiments can include one or more of the following features.

The pattern can be, for example, a camouflage pattern, a roof tile pattern, a shingle pattern. In some embodiments, the pattern provided by the photovoltaic cell can define the pattern of the housing a portable electronic device (e.g., a laptop computer, a cell phone). In certain embodiments, the pattern provided by the photovoltaic cell can define the pattern on the body of an automobile.

The photoactive layer can include at least two (e.g., at least three, at least four, at least five, at least six, at least seven, at least eight) different polymer compositions. At least some of the polymer compositions (e.g., at least two of the polymer compositions, at least three of the polymer compositions, at least four of the polymer compositions) can have a different color. For example, each of the polymer compositions can have a different color.

The polymer compositions can be combined with the material (e.g., electron acceptor) using silk screening, ink jet printing, or gravure printing.

In some of the embodiments, the polymer composition(s) contained in the photoactive layer can include one or more of discotic liquid crystal polymers, one or more polythiophenes, one or more polyphenylenes, one or more poly(phenylenevinylene)s, one or more polythienylvinylenes, and/or one or more polyisothianaphthalenes.

The material with which the polymer compositions are combined can be an electron acceptor material. The electron acceptor material can be formed of fullerenes, inorganic nanoparticles, oxadiazoles, discotic liquid crystals, carbon nanorods, inorganic nanorods, polymers containing CN groups, and/or polymers containing $CF_3$ groups.

The photovoltaic cell can further include a substrate, such as a polymer substrate, that supports the photo active layer. The substrate can be formed of a polyethylene terephthalate, a polyethylene naphthalate, a polyethylene, a polypropylene, a polyamide, a polymethacrylate, a polycarbonate, and/or a polyurethane.

In another aspect, the invention features a formulation containing cis-RuLL'$(NCS)_2$ and an organic solvent, in which L can include a first 2,2'-bipyridyl and L' can include a second 2,2'-bipyridyl. The organic solvent can be selected from the group consisting of g-butyrolactone (GBL), 1-methoxy-2-propanol (MP), N,N-dimethyl formamide, N,N-dimethylacetamide, propylene glycol phenyl ether, and a mixture thereof.

In still another aspect, the invention features a formulation containing a dye and a thickening agent.

In an additional aspect, the invention features a method that includes disposing a formulation comprising cis-RuLL'$(NCS)_2$ and a first organic solvent on a first material to form a photoactive layer, and disposing the photoactive layer between two electrodes to provide a photovoltaic cell. L includes a first 2,2'-bipyridyl and L' includes a second 2,2'-bipyridyl. The first organic solvent is selected from the group consisting of g-butyrolactone, 1-methoxy-2-propanol, N,N-dimethyl formamide, N,N-dimethylacetamide, propylene glycol phenyl ether, and a mixture thereof.

In a further aspect, the invention features a method that includes disposing a formulation containing a dye and a thickening agent on a first material to form a photoactive layer, and disposing the photoactive layer between two electrodes to provide a photovoltaic cell.

Embodiments can include one or more of the following features.

The first 2,2'-bipyridyl can be the same as the second 2,2'-bipyridyl.

L can include 4,4'-dicarboxylic acid-2,2'-bipyridyl and L' can include 4,4'-dinonyl-2,2'-bipyridyl.

The formulation can further include about 1 wt % to about 20 wt % (e.g., about 5 wt % to about 15 wt %, or about 12 wt %) of a thickening agent. Exemplary thickening agents include fumed silica particles and poly(propylene glycol) (PPG). Fumed silica particles can be hydrophobic. For example, a surface of the fumed silica particles can be modified with hydrophobic groups (e.g., poly(dimethyl siloxane) moieties).

The organic solvent can include a mixture of g-butyrolactone and 1-methoxy-2-propanol (e.g., at a ratio of about 1:5 vol./vol. to about 1:10 vol./vol.).

The formulation can include a mixture of g-butyrolactone, 1-methoxy-2-propanol, and poly(propylene glycol) (e.g., at a ratio of about 1:5:2 vol./vol./vol.).

The formulation can include at least about 5 mM cis-RuLL'$(NCS)_2$ (e.g., at least about 20 mM cis-RuLL'$(NCS)_2$, at least about 30 mM cis-RuLL'$(NCS)_2$, at least about 40 mM cis-RuLL'$(NCS)_2$, or at least about 60 mM cis-RuLL'$(NCS)_2$).

The method can further include substantially removing the thickening agent by washing the photoactive layer with a second organic solvent (e.g., an alcohol).

65 mg of cis-RuLL'$(NCS)_2$ can be absorbed onto 1 g of the first material in at most about 5 minutes (e.g., at most about 4 minutes, at most about 3 minutes, at most about 2 minutes, or at most about 1 minute).

The first material can include a semiconductor material or an electron acceptor material.

Other features and advantages of the invention will be apparent from the description, drawings and claims.

DESCRIPTION OF DRAWINGS

Like reference symbols in the various drawings indicate like elements.

DETAILED DESCRIPTION

A patterned photovoltaic cell can have the appearance of any desired pattern. The pattern can be, for example, a camouflage pattern, a roof tile pattern, a shingle pattern. In some embodiments, the pattern provided by the photovoltaic cell can define the pattern of the housing a portable electronic device (e.g., a laptop computer, a cell phone). In certain embodiments, the pattern provided by the photovoltaic cell can define the pattern on the body of an automobile. In general, a pattern can be formed by using multiple photosensitizing agents (dyes) of different color in the photoactive layer of a DSSC.

Figure 2:
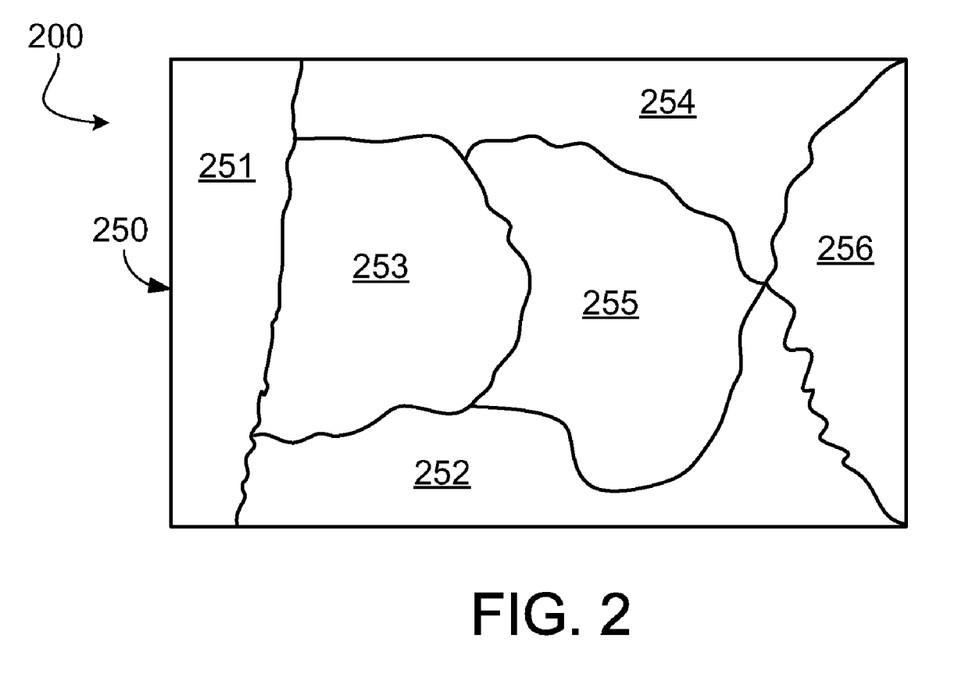
FIG. 2 is a top view of an embodiment of a patterned photoactive layer of a photovoltaic cell.
Figure 3:
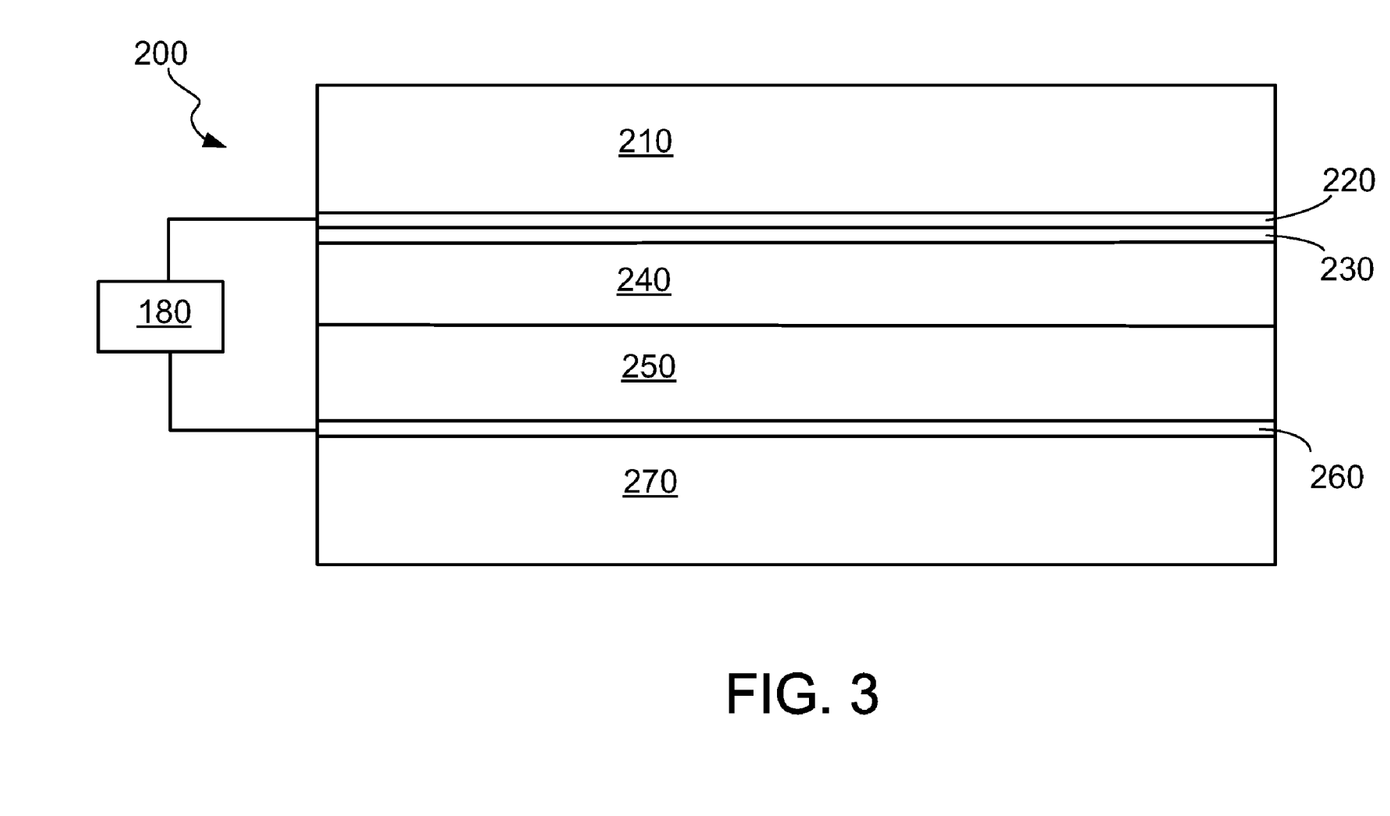
FIG. 3 is a cross-sectional view of the photovoltaic cell of FIG. 2.

FIG. 2 is a top view of a photoactive layer 250 of a DSSC 200, and FIG. 3 is a cross-sectional view of DSSC 200. Photoactive layer 250 includes regions 251-256 that form a pattern. The pattern results from at least some of the regions being of different color. As an example, in some embodiments, each of regions 251-256 has a different color. More generally, however, at least two of regions (e.g., at least three of regions, at least four of the regions, at least five of the regions) 251-256 have a different color.

In general, the color of each region 251-156 is determined by the particular dye (or combination of dyes) contained within the given region. Examples of dyes include black dyes (e.g., tris(isothiocyanato)-ruthenium (II)-2,2':6',2"-terpyridine-4,4',4"-tricarboxylic acid, tris-tetrabutylammonium salt), orange dyes (e.g., tris(2,2'-bipyridyl-4,4'-dicarboxylato) ruthenium (II) dichloride, purple dyes (e.g., cis-bis (isothiocyanato)bis-(2,2'-bipyridyl-4,4'-dicarboxylato)-ruthenium (II)), red dyes (e.g., an eosin), green dyes (e.g., a merocyanine) and blue dyes (e.g., a cyanine). Examples of additional dyes include cyanines, xanthenes, anthraquinones, merocyanines, phenoxazinones, indolines, thiophenes, coumarins, anthocyanines, porphyrins, phthalocyanines, squarates, squarylium dyes, and certain metal-containing dyes. Combinations of dyes can also be used within a given region so that a given region can include more than one (e.g., two, three, four, five, six, seven) different dyes.

In some embodiments, photoactive layer 250 can include a dye having a formula cis-RuLL'(NCS)$_2$, in which L can include a first 2,2'-bipyridyl and L' can include a second 2,2'-bipyridyl. The first 2,2'-bipyridyl can be the same as or can be different from the second 2,2'-bipyridyl. The term "2,2'-bipyridal" mentioned herein includes both substituted and unsubstituted moieties. Examples of substituents include $C_1$-$C_{10}$ alkyl, $C_2$-$C_{10}$ alkenyl, $C_2$-$C_{10}$ alkynyl, $C_3$-$C_8$ cycloalkyl, $C_5$-$C_8$ cycloalkenyl, $C_1$-$C_{10}$ alkoxy, aryl, aryloxy, heteroaryl, heteroaryloxy, amino, $C_1$-$C_{10}$ alkylamino, $C_1$-$C_{20}$ dialkylamino, arylamino, diarylamino, heteroarylamino, diheteroarylamino, $C_1$-$C_{10}$ alkylsulfonyl, arylsulfonyl, heteroarylsulfonyl, $C_1$-$C_{10}$ alkylsulfonamide, arylsulfonamide, heteroarylsulfonamide, hydroxyl, halogen, mercapto, $C_1$-$C_{10}$ alkylmercapto, arylmercapto, cyano, nitro, acyl, acyloxy, carboxyl, amido, carbamoyl, and carboxylic ester. Cycloalkyl, heterocycloalkyl, aryl, and heteroaryl also include fused groups.

An example of cis-RuLL'(NCS)$_2$ is cis-Ru(4,4'-dicarboxylic acid-2,2'-bipyridyl)(4,4'-dinonyl-2,2'-bipyridyl)(NCS)$_2$ (Z907). In certain embodiments, Z907 is first dissolved in a suitable organic solvent to form a dye solution. The organic solvent typically has low vapor pressure (e.g., <10 mmHg at 20° C.), good dye solubility (e.g., dissolving more than 5 mM of the dye), high permittivity and wettability to the semiconductor material in a photoactive layer (e.g., TiO$_2$ nanoparticles), thereby facilitating dye absorbance to the semiconductor material and reducing the dyeing time. Examples of such organic solvents include g-butyrolactone, 1-methoxy-2-propanol, N,N-dimethyl formamide, N,N-dimethylacetamide, propylene glycol phenyl ether, and a mixture thereof. The dye solution can then be applied to a semiconductor material by one or more methods disclosed herein. The dyeing process using such a dye solution can have a relatively short dyeing time. In certain embodiments, by using a dyeing solution mentioned above, 65 mg of Z907 can be absorbed onto 1 g of the semiconductor material in at most about 5 minutes, (e.g., at most about 4 minutes, at most about 3 minutes, at most about 2 minutes, or at most about 1 minute).

In some embodiments, a thickening agent can be added to a solution containing a dye (e.g., a ruthenium based dye such as Z907 or an organic dye). The thickening agent can reduce the dyeing time. It can also be used to adjust the rheology (e.g., the viscosity) of the dye solution by using different concentrations. Exemplary thickening agents include dispensible fumed silica particles and poly(propylene glycol). After the dye is absorbed onto a semiconductor material, the thickening agent can be optionally removed by washing the semiconductor material with an organic solvent (e.g., ethanol or 1-methoxy-2-propanol).

In some embodiments, the fumed silica particles can be modified to form a hydrophobic surface. For example, the surface of the fumed silica particles can be modified with poly(dimethyl siloxane) moieties. An example of such a hydrophobic silica is CAB-O-SIL TS-720 manufactured by CABOT CORPORATION. Hydrophobic silica particles can improve the thermal stability of a photovoltaic cell. Without wishing to be bound by theory, it is believed that hydrophobic silica particles can minimize the contact between the dye and the electrolyte in the photovoltaic cell, thereby reducing dye desorption.

Photoactive layer 250 also includes an additional material, such as a semiconductor material, that is associated with the dyes. Examples of semiconductor materials include materials having the formula $M_xO_y$, where M may be, for example, titanium, zirconium, tungsten, niobium, lanthanum, tantalum, terbium, or tin and x and y are integers greater than zero. Other suitable materials include sulfides, selenides, tellurides, and oxides of titanium, zirconium, tungsten, niobium, lanthanum, tantalum, terbium, tin, or combinations thereof. For example, $TiO_2$, $SrTiO_3$, $CaTiO_3$, $ZrO_2$, $WO_3$, $La_2O_3$, $Nb_2O_5$, $SnO_2$, sodium titanate, cadmium selenide (CdSe), cadmium sulphides, and potassium niobate may be suitable materials.

Typically, the semiconductor material contained within layer 250 is in the form of nanoparticles. In some embodiments, the nanoparticles have an average size between about two nm and about 100 nm (e.g., between about 10 nm and 40 nm, such as about 20 nm).

The nanoparticles can be interconnected, for example, by high temperature sintering, or by a reactive polymeric linking agent, such as poly(n-butyl titanate). A polymeric linking agent can enable the fabrication of an interconnected nanoparticle layer at relatively low temperatures (e.g., less than about 300° C.) and in some embodiments at room temperature. The relatively low temperature interconnection process may be amenable to continuous manufacturing processes using polymer substrates.

The interconnected nanoparticles are generally photosensitized by the dye(s). The dyes facilitates conversion of incident light into electricity to produce the desired photovoltaic effect. It is believed that a dye absorbs incident light resulting in the excitation of electrons in the dye. The energy of the excited electrons is then transferred from the excitation levels of the dye into a conduction band of the interconnected nanoparticles. This electron transfer results in an effective separation of charge and the desired photovoltaic effect. Accordingly, the electrons in the conduction band of the interconnected nanoparticles are made available to drive an external load.

The dye(s) can be sorbed (e.g., chemisorbed and/or physisorbed) on the nanoparticles. A dye can be selected, for example, based on its ability to absorb photons in a wavelength range of operation (e.g., within the visible spectrum), its ability to produce free electrons (or electron holes) in a conduction band of the nanoparticles, its effectiveness in complexing with or sorbing to the nanoparticles, and/or its color.

Turning now to other components of DSSC 200, the composition and thickness of electrically conductive layer 220 is generally selected based on desired electrical conductivity, optical properties, and/or mechanical properties of the layer. In some embodiments, layer 220 is transparent. Examples of transparent materials suitable for forming such a layer include certain metal oxides, such as indium tin oxide (ITO), tin oxide, and a fluorine-doped tin oxide. In some embodiments, electrically conductive layer 220 can be formed of a foil (e.g., a titanium foil). Electrically conductive layer 220 may be, for example, between about 100 nm and 500 nm thick, (e.g., between about 150 nm and 300 nm thick).

In embodiments where counter electrode 211 is not transparent, electrically conductive layer 220 can be opaque (i.e., can transmit less than about 10% of the visible spectrum energy incident thereon). For example, layer 220 can be formed from a continuous layer of an opaque metal, such as copper, aluminum, indium, or gold.

In some embodiments, electrically conductive layer 220 can include a discontinuous layer of a conductive material. For example, electrically conductive layer 220 can include an electrically conducting mesh. Suitable mesh materials include metals, such as palladium, titanium, platinum, stainless steels and alloys thereof. In some embodiments, the mesh material includes a metal wire. The electrically conductive mesh material can also include an electrically insulating material that has been coated with an electrically conducting material, such as a metal. The electrically insulating material can include a fiber, such as a textile fiber or monofilament. Examples of fibers include synthetic polymeric fibers (e.g., nylons) and natural fibers (e.g., flax, cotton, wool, and silk). The mesh electrode can be flexible to facilitate, for example, formation of the DSSC by a continuous manufacturing process. Photovoltaic cells having mesh electrodes are disclosed, for example, in co-pending U.S. Patent Application Publication No. 2003/0230337, U.S. Patent Application Publication No. 2004/0187911, and International Patent Application Publication Number WO 03/04117, each of which is hereby incorporated by reference.

The mesh electrode may take a wide variety of forms with respect to, for example, wire (or fiber) diameters and mesh densities (i.e., the number of wires (or fibers) per unit area of the mesh). The mesh can be, for example, regular or irregular, with any number of opening shapes. Mesh form factors (such as, e.g., wire diameter and mesh density) can be chosen, for example, based on the conductivity of the wire (or fibers) of the mesh, the desired optical transmissivity, flexibility, and/or mechanical strength. Typically, the mesh electrode includes a wire (or fiber) mesh with an average wire (or fiber) diameter in the range from about one micron to about 400 microns, and an average open area between wires (or fibers) in the range from about 60% to about 95%.

Catalyst layer 230 is generally formed of a material that can catalyze a redox reaction in the charge carrier layer positioned below. Examples of materials from which catalyst layer can be formed include platinum and poly(3,4-ethylenedioxythiophene) (PEDOT). PEDOT layers are discussed in U.S. Ser. No. 60/495,302, which is hereby incorporated by reference. Materials can be selected based on criteria such as, e.g., their compatibility with manufacturing processes, long term stability, and optical properties. In general, the catalyst layer is substantially transparent. However, in certain embodiments, (e.g., embodiments in which the cathodes are substantially transparent) the catalyst layer can be substantially opaque.

Substrate 210 can be formed from a mechanically-flexible material, such as a flexible polymer, or a rigid material, such as a glass. Examples of polymers that can be used to form a flexible substrate include polyethylene naphthalates (PEN), polyethylene terephthalates (PET), polyethyelenes, polypropylenes, polyamides, polymethylmethacrylate, polycarbonate, and/or polyurethanes. Flexible substrates can facilitate continuous manufacturing processes such as web-based coating and lamination.

The thickness of substrate 210 can vary as desired. Typically, substrate thickness and type are selected to provide mechanical support sufficient for the DSSC to withstand the rigors of manufacturing, deployment, and use. Substrate 210 can have a thickness of from about six microns to about 5,000 microns (e.g., from about 6 microns to about 50 microns, from about 50 microns to about 5,000 microns, from about 100 microns to about 1,000 microns).

In embodiments where the counter electrode is transparent, substrate 210 is formed from a transparent material. For example, substrate 210 can be formed from a transparent glass or polymer, such as a silica-based glass or a polymer, such as those listed above. In such embodiments, electrically conductive layer 220 should also be transparent.

Substrate 270 and electrically conductive layer 260 can be similar to substrate 210 and electrically conductive layer 220, respectively. For example, substrate 270 can be formed from the same materials and can have the same thickness as substrate 210. In some embodiments however, it may be desirable for substrate 270 to be different from 210 in one or more aspects. For example, where the DSSC is manufactured using a process that places different stresses on the different substrates, it may be desirable for substrate 270 to be more or less mechanically robust than substrate 210. Accordingly, substrate 270 may be formed from a different material, or may have a different thickness that substrate 210. Furthermore, in embodiments where only one substrate is exposed to an illumination source during use, it is not necessary for both substrates and/or electrically conducting layers to be transparent. Accordingly, one of substrates and/or corresponding electrically conducting layer can be opaque.

As discussed previously, charge carrier layer 240 includes a material that facilitates the transfer of electrical charge from a ground potential or a current source to photoactive layer 260. A general class of suitable charge carrier materials include solvent-based liquid electrolytes, polyelectrolytes, polymeric electrolytes, solid electrolytes, n-type and p-type transporting materials (e.g., conducting polymers) and gel electrolytes. Other choices for charge carrier media are possible. For example, the charge carrier layer can include a lithium salt that has the formula LiX, where X is an iodide, bromide, chloride, perchlorate, thiocyanate, trifluoromethyl sulfonate, or hexafluorophosphate.

The charge carrier media typically includes a redox system. Suitable redox systems may include organic and/or inorganic redox systems. Examples of such systems include cerium(III) sulphate/cerium(IV), sodium bromide/bromine, lithium iodide/iodine, $Fe^{2+}/Fe^{3+}$, $Co^{2+}/Co^{3+}$, and viologens. Furthermore, an electrolyte solution may have the formula $M_iX_j$, where i and j are greater than or equal to one, where X is an anion, and M is lithium, copper, barium, zinc, nickel, a lanthanide, cobalt, calcium, aluminum, or magnesium. Suitable anions include chloride, perchlorate, thiocyanate, trifluoromethyl sulfonate, and hexafluorophosphate.

In some embodiments, the charge carrier media includes a polymeric electrolyte. For example, the polymeric electrolyte can include poly(vinyl imidazolium halide) and lithium iodide and/or polyvinyl pyridinium salts. In embodiments, the charge carrier media can include a solid electrolyte, such as lithium iodide, pyridimum iodide, and/or substituted imidazolium iodide.

The charge carrier media can include various types of polymeric polyelectrolytes. For example, suitable polyelectrolytes can include between about 5% and about 95% (e.g., 5-60%, 5-40%, or 5-20%) by weight of a polymer, e.g., an ion-conducting polymer, and about 5% to about 95% (e.g., about 35-95%, 60-95%, or 80-95%) by weight of a plasticizer, about 0.05 M to about 10 M of a redox electrolyte of organic or inorganic iodides (e.g., about 0.05-2 M, 0.05-1 M, or 0.05-0.5 M), and about 0.01 M to about 1 M (e.g., about 0.05-0.5 M, 0.05-0.2 M, or 0.05-0.1 M) of iodine. The ion-conducting polymer may include, for example, polyethylene oxide (PEO), polyacrylonitrile (PAN), polymethylmethacrylate (PMMA), polyethers, and polyphenols. Examples of suitable plasticizers include ethyl carbonate, propylene carbonate, mixtures of carbonates, organic phosphates, butyrolactone, and dialkylphthalates.

Figure 4:
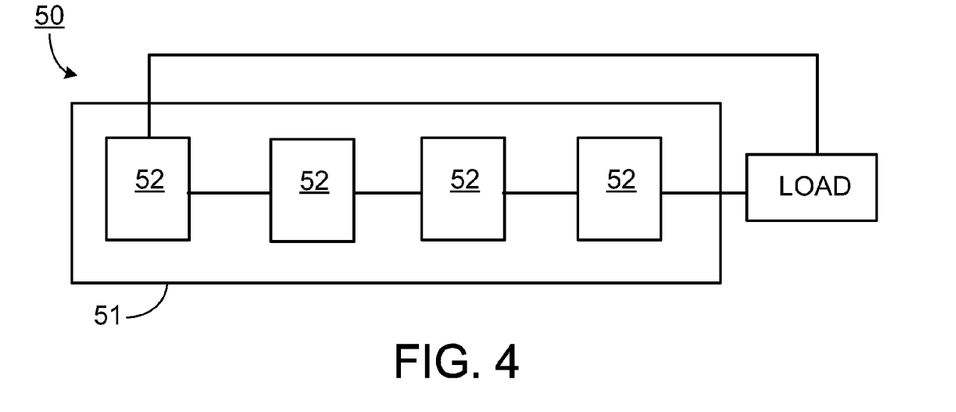
FIG. 4 is a schematic of a system containing multiple photovoltaic cells electrically connected in series.
Figure 5:
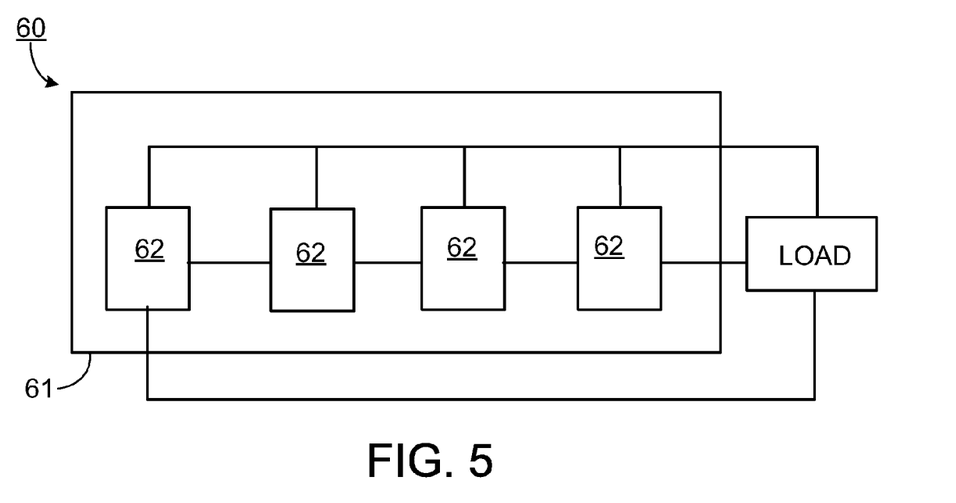
FIG. 5 is a schematic of a system containing multiple photovoltaic cells electrically connected in parallel.

Multiple photovoltaic cells can be electrically connected to form a photovoltaic system. As an example, FIG. 4 is a schematic of a photovoltaic system 50 having a module 51 containing photovoltaic cells 52. Cells 52 are electrically connected in series, and system 50 is electrically connected to a load. As another example, FIG. 5 is a schematic of a photovoltaic system 60 having a module 61 that contains photovoltaic cells 62. Cells 62 are electrically connected in parallel, and system 60 is electrically connected to a load. In some embodiments, some (e.g., all) of the photovoltaic cells in a photovoltaic system can have one or more common substrates. In certain embodiments, some photovoltaic cells in a photovoltaic system are electrically connected in series, and some of the photovoltaic cells in the photovoltaic system are electrically connected in parallel.

Figure 6:
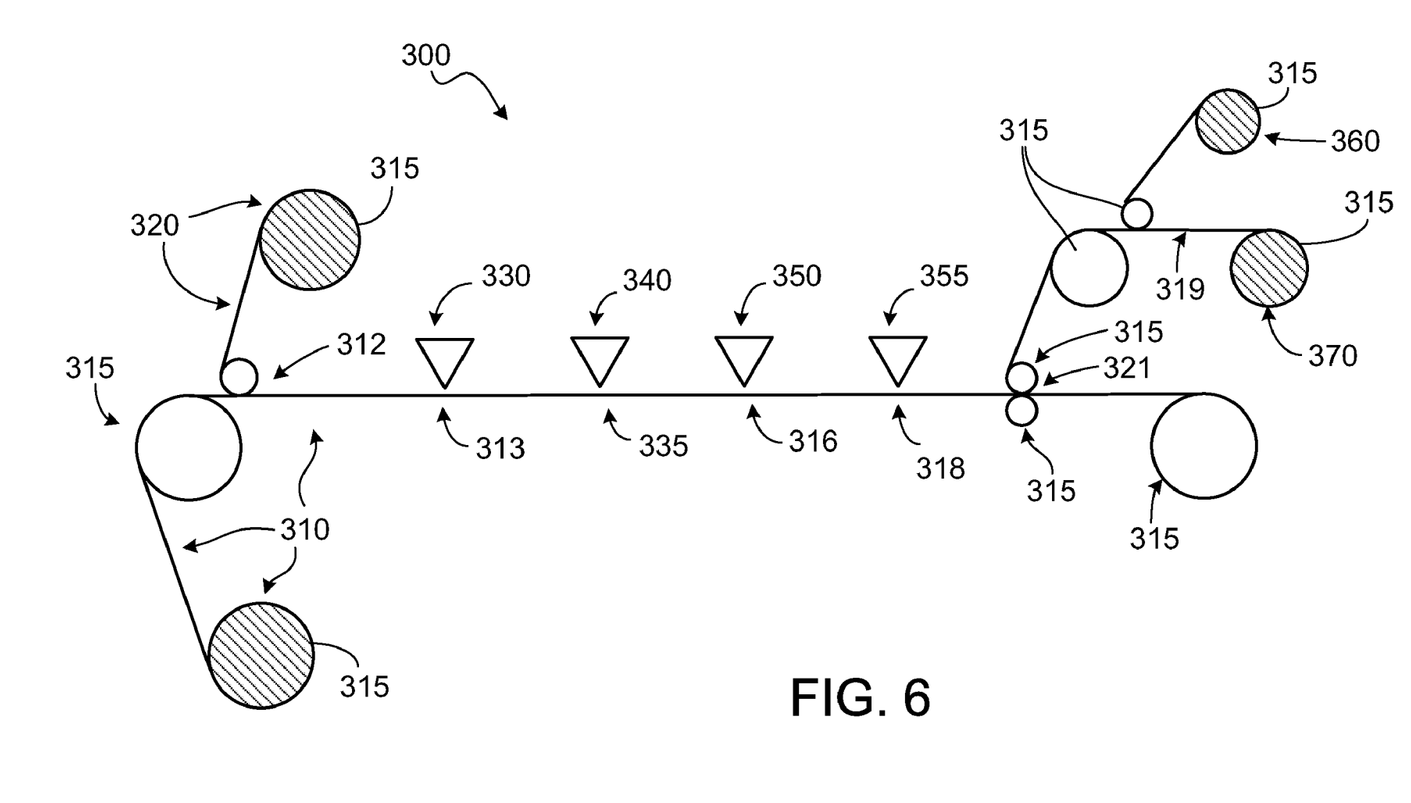
FIG. 6 illustrates an embodiment of a process for manufacturing a patterned photovoltaic cell.

FIG. 6 shows a process (a roll-to-roll process) 300 for manufacturing a patterned photovoltaic cell by advancing a substrate 310 between rollers 315. Substrate 310 can be advanced between rollers 315 continuously, periodically, or irregularly during a manufacturing run.

An electrically conductive layer 320 (e.g., a titanium foil) is attached to substrate 310 adjacent location 312.

An interconnected nanoparticle material is then formed on the electrically conductive layer adjacent location 313. The interconnected nanoparticle material can be formed by applying a solution containing a polymeric linking agent (e.g., poly(n-butyl titanate)) and metal oxide nanoparticles (e.g., titania). In some embodiments, the polymeric linking agent and the metal oxide nanoparticles are separately applied to form the interconnected nanoparticle material. The polymeric linking agent and metal oxide nanoparticles can be heated (e.g., in an oven present in the system used in the roll-to-roll process) to form the interconnected nanoparticle material.

A plurality of dyes is then applied to the interconnected nanoparticle material adjacent location 335 to form a patterned photoactive layer. The dyes can be applied using known methods, including those noted above. In some embodiments, the different dyes are simultaneously applied to the interconnected nanoparticle material (e.g., using ink jet printing). In certain embodiments, multiple stations are used, with a different dye being applied to the interconnected nanoparticle material (e.g., using ink jet printing) at each station. Combinations of these methods can also be used.

A charge carrier layer is deposited onto the patterned photoactive layer adjacent location 316. The charge carrier layer can be deposited using known techniques, such as those noted above.

An electrically conductive layer 360 (e.g., ITO) is attached to substrate 370 adjacent location 319.

A catalyst layer precursor is deposited on electrically conductive layer 360 adjacent location 318. The catalyst layer precursor can be deposited on electrically conductive layer 360 using, for example, electrochemical deposition using chloroplatinic acid in an electrochemical cell, or pyrolysis of a coating containing a platinum compound (e.g., chloroplatinic acid). In general, the catalyst layer precursor can be deposited using known coating techniques, such as spin coating, dip coating, knife coating, bar coating, spray coating, roller coating, slot coating, gravure coating, screen coating, and/or ink jet printing. The catalyst layer precursor is then heated (e.g., in an oven present in the system used in the roll-to-roll process) to form the catalyst layer. In some embodiments, electrically conductive material 360 can be at least partially coated with the catalyst layer before attaching to advancing substrate 370. In certain embodiments, the catalyst layer is applied directly to electrically conductive layer 360 (e.g., without the presence of a precursor).

While certain embodiments have been described, other embodiments are possible.

Figure 7:
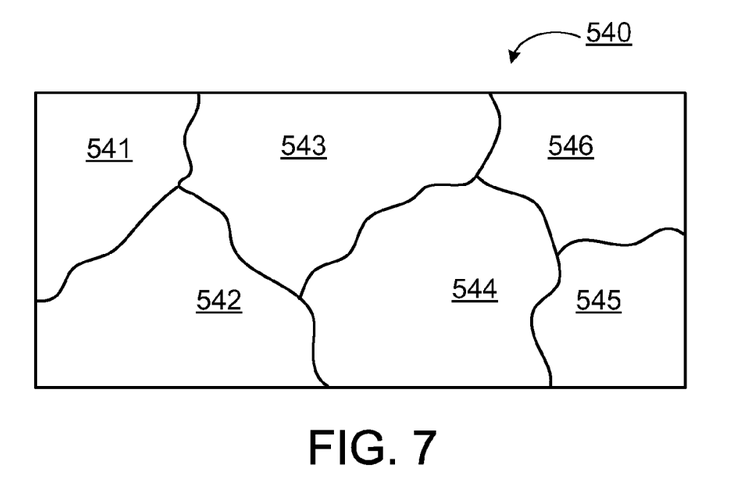
FIG. 7 is a top view of an embodiment of a patterned photoactive layer of a photovoltaic cell.
Figure 8:
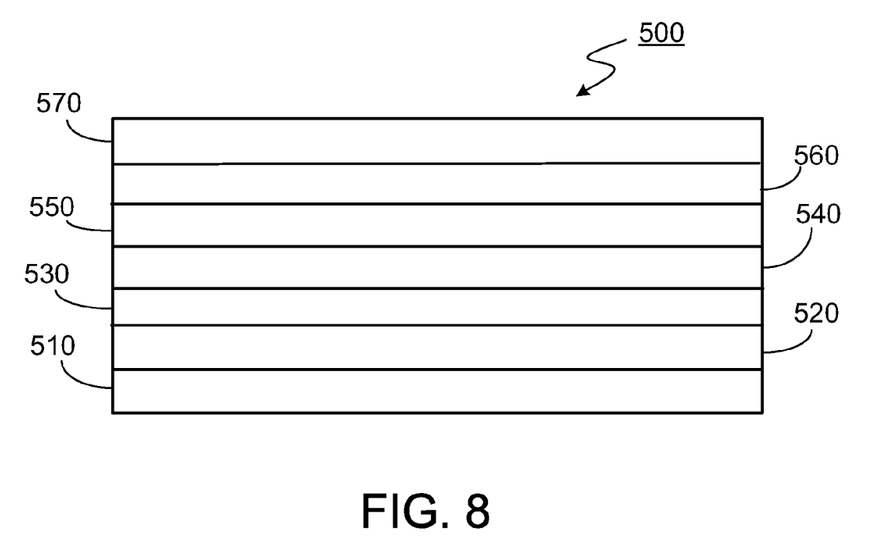
FIG. 8 is a cross-sectional view of the photovoltaic cell of FIG. 7.

As an example, while embodiments of patterned DSSCs have been described, other types of patterned photovoltaic cells (e.g., patterned polymer organic photovoltaic cells) are also possible. For example, FIG. 7 is a top view of a photoactive layer 550 of a polymer organic photovoltaic cell 500, and FIG. 8 is a cross-sectional view of cell 500. Cell 500 includes a transparent substrate 510, a cathode 520, a hole carrier layer 530, a photoactive layer (containing an electron acceptor material and an electron donor material) 540, a hole blocking layer 550, an anode 560, and a substrate 570.

Photoactive layer 540 includes multiple regions 541-546. Two or more of the different regions of photoactive layer 540 can each include a different polymer composition as the electron donor material within that region. At least two (e.g., at least three, at least four, at least five) of the polymer compositions have a different color so that cell 500 appears patterned (e.g., having one of the patterns noted above). Examples of polymer compositions include discotic liquid crystal polymers, polythiophenes, polyphenylenes, poly(phenylene-vinylene)s, polythienylvinylenes, polyisothianaphthalenes, and combinations thereof.

Examples of the electron acceptor materials that can be used in photoactive layer 540 include fullerenes, inorganic nanoparticles (e.g., nanoparticles formed of zinc oxide, tungsten oxide, indium phosphide, cadmium selenide and/or lead sulphide), oxadiazoles, discotic liquid crystals, carbon nanorods, inorganic nanorods (e.g., nanorods formed of zinc oxide, tungsten oxide, indium phosphide, cadmium selenide and/or lead sulphide), or polymers containing moieties capable of accepting electrons or forming stable anions (e.g., polymers containing CN groups or polymers containing $CF_3$ groups), and combinations thereof In some embodiments, at least some of the polymer dyes in photoactive layer 250 have a different color. For example, photoactive layer 250 can include at least three polymer dyes, each having a different color. In certain embodiments, each of the polymer dyes has a different color.

Examples of polymer organic photovoltaic cells are described, for example, in U.S. Patent Application Publication No. 2004/0187911, and co-pending an commonly owned U.S. Ser. No. 60/576,033, both of which are hereby incorporated by reference.

Multiple polymer organic photovoltaic cells can be electrically connected (e.g., as described above).

The following examples are illustrative and not intended to be limiting.

Example 1

Three dye solutions were prepared and tested for their PV performance: (1) 24 mM of Z907 in GBL/MP (1:10 vol./vol.), (2) 40 mM of Z907 in GBL/MP/PPG (1:5:2 vol./vol./vol.), and (3) 40 mM of Z907 in GBL/MP (1:5 vol./vol.) with 12 wt % fumed silica. Specifically, the dye solutions were prepared by dispersing Z907 and optionally fumed silica powder into a mixture of solvents at the above-mentioned concentrations. The solutions were then heated to 80° C. and/or ultrasonicated until all solids were well dispersed in the solutions. Sintered $TiO_2$ coating with a thickness of about 12 μm and a surface area of about 70 $m^2/g$ was dyed with the above three dye solutions at room temperature for certain periods of times and then rinsed by ethanol. The dyeing time was measured from the application of a dye solution on the $TiO_2$ coating to the rinsing of the $TiO_2$ coating by ethanol. The dyed $TiO_2$ coating was then used to prepare photovoltaic cells.

The results showed that, for each of these three dye solutions, 65 mg of Z907 was absorbed onto 1 g of $TiO_2$ in about 5 minutes or less. In particular, 65 mg of Z907 in dye solution (3) was absorbed onto 1 g $TiO_2$ in about 1 minute. Further, the results showed that including a thickening agent (i.e., PPG or fumed silica) in a dye solution did not adversely change the efficiency of the photovoltaic cell. The photovoltaic cells prepared from the above three dye solutions all exhibited about 3.0% efficiencies.

Example 2

Two dye solutions were prepared and tested for their thermal stability: (1) 24 mM of Z907 in GBL/MP (1:10 vol./vol.) without CAB-O-SIL TS-720 silica, and (2) 40 mM of Z907 in GBL/MP (1:5 vol./vol.) with 1 wt % CAB-O-SIL TS-720 silica. The dye solutions were then used to prepare photovoltaic cells in a manner similar to that described in Example 1. The photovoltaic cells thus obtained were then aged at 70° C. for 500 hours.

The results showed that the photovoltaic cell without CAB-O-SIL TS-720 silica exhibited about 24% loss in efficiency, while the photovoltaic cell containing 1 wt % CAB-O-SIL TS-720 silica exhibited only about 15% loss in efficiency.

Other embodiments are in the claims.

What is claimed is:

1. A method, comprising:
   forming a formulation containing a dye and a thickening agent, the thickening agent comprising fumed silica particles,
   after forming the formulation, disposing the formulation on a first material to form a photoactive layer, and
   disposing the photoactive layer between two electrodes to provide a photovoltaic cell,
   wherein the formulation comprises about 1 wt % to about 20 wt % of the fumed silica particles.

2. The method of claim 1, wherein the formulation comprises about 12 wt % of the fumed silica particles.

3. A method, comprising:
   forming a formulation containing a dye and a thickening agent,
   after forming the formulation, disposing the formulation on a first material to form a photoactive layer, and
   disposing the photoactive layer between two electrodes to provide a photovoltaic cell,
   wherein the thickening agent comprises fumed silica particles having a surface modified with poly(dimethyl siloxane) moieties.

4. A method, comprising:
   forming a formulation containing a dye and a thickening agent,
   after forming the formulation, disposing the formulation on a first material to form a photoactive layer, and
   disposing the photoactive layer between two electrodes to provide a photovoltaic cell,
   wherein the formulation further comprises an organic solvent selected from the group consisting of g-butyrolactone, 1-methoxy-2-propanol, N,N-dimethylacetamide, propylene glycol phenyl ether, and mixtures thereof.

5. The method of claim 4, wherein the organic solvent comprises a mixture of g-butyrolactone and 1-methoxy-2-propanol.

6. The method of claim 5, wherein g-butyrolactone and 1-methoxy-2-propanol are mixed at a ratio of about 1:5 vol./vol. to about 1:10 vol./vol.

* * * * *